(12) United States Patent
Ravkin (10) Patent No.: US 6,290,780 B1
(45) Date of Patent: Sep. 18, 2001

(54) METHOD AND APPARATUS FOR PROCESSING A WAFER

(75) Inventor: Michael Ravkin, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/272,874

(22) Filed: Mar. 19, 1999

(51) Int. Cl.⁷ ....................................................... B08B 7/00
(52) U.S. Cl. .................................. 134/6; 134/902; 15/77; 15/97.1; 15/102; 15/302
(58) Field of Search ............................. 139/6, 902; 15/77, 15/97.1, 102, 302

(56) References Cited

U.S. PATENT DOCUMENTS

| | | | |
|---|---|---|---|
| 5,351,360 | * 10/1994 | Suzuki et al. | 15/302 |
| 5,624,501 | 4/1997 | Gill, Jr. | 134/6 |
| 5,675,856 | * 10/1997 | Itzkowitz | 15/77 |
| 5,725,414 | * 3/1998 | Moinpour et al. | 15/77 |
| 5,794,299 | * 8/1998 | Gockel et al. | 15/77 |
| 5,861,066 | 1/1999 | Moinpour et al. | 134/6 |
| 5,862,560 | * 1/1999 | Jensen et al. | 15/77 |
| 5,868,857 | * 2/1999 | Moinpour et al. | 134/6 |
| 5,894,622 | * 4/1999 | Manfredi et al. | 15/102 |
| 5,901,399 | * 5/1999 | Moinpour et al. | 15/77 |
| 6,059,891 | * 5/2000 | Kubota et al. | 134/18 |

FOREIGN PATENT DOCUMENTS 0893819   1/1999 (EP) .

* cited by examiner

Primary Examiner—Alexander Markoff
(74) Attorney, Agent, or Firm—Martine & Penilla, LLP (57) ABSTRACT

A method and apparatus for processing wafer edges is disclosed. Pressure applied to the wafer at one end of A brush/pad assembly is greater than at the opposite end of the brush/pad assembly. The increased pressure causes wafer rotation to slow or to reverse direction as compared to less pressure applied by the brush/pad assembly. In one embodiment slowed rotation causes a difference in tangential velocity between the roller(s) and the wafer edge/bevel that causes pads in the roller(s) to process the edge/bevel of the wafer. In another embodiment, the opposite direction of rotation causes the wafer to rotate counter to rollers otherwise causing the wafer to rotate. Cleaning surfaces in the rollers clean the edges of the wafer whether rotation is slowed or reversed.

20 Claims, 8 Drawing Sheets

METHOD AND APPARATUS FOR PROCESSING A WAFER

FIELD OF THE INVENTION

The present invention relates to semiconductor wafer processing; more particularly, the present invention relates to an apparatus for use in buffing and/or cleaning the edge/bevel of semiconductor wafers.

BACKGROUND OF THE INVENTION

Double sided scrubbers clean the top and the bottom of a wafer simultaneously. Double sided scrubbers are usually automated and comprise a conveyor type mechanism, rollers, and brushes. In general, the wafer lies flat on the conveyor mechanism and the conveyor mechanism moves the wafer into the brushes. While being scrubbed, the wafer is supported (or held horizontally) by the conveyor mechanism, brushes, rollers, or a combination thereof.

Figure 1:
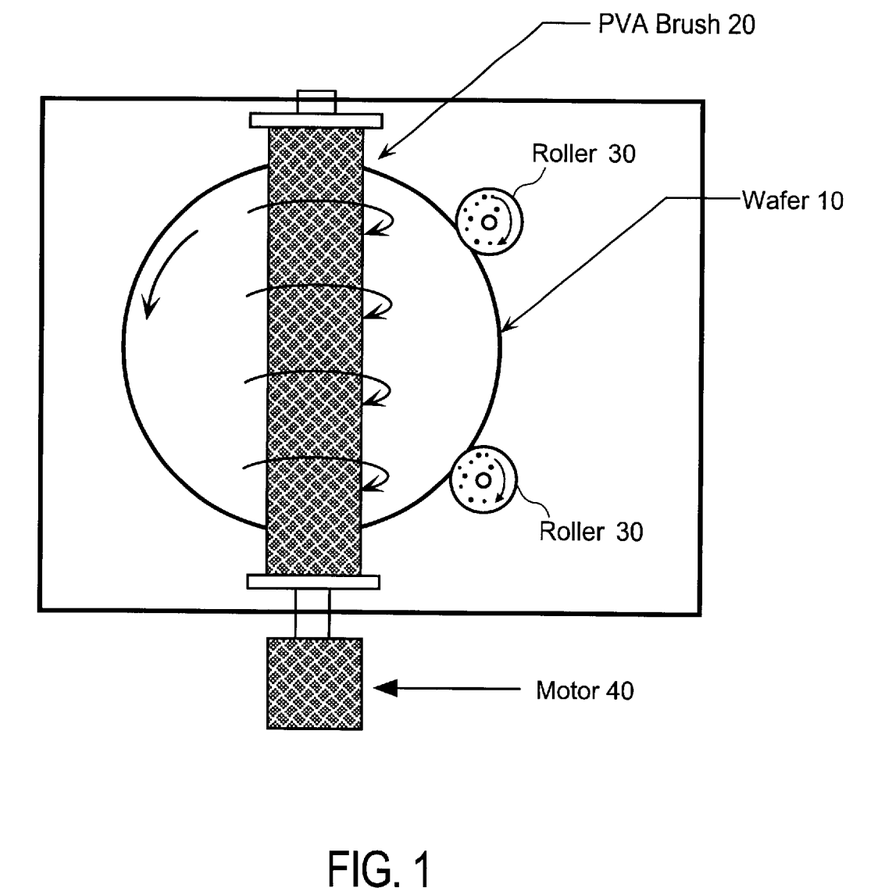
FIG. 1 is a general view a conventional double sided wafer processing system.

FIG. 1 is a general view of a conventional double sided wafer processing station. Wafer 10 is processed by brushes, one of which is shown as brush 20 and the other (not shown in FIG. 1) is beneath wafer 10 and directly below brush 20. Rollers 30 rotate wafer 10 so the entire wafer surface may be processed. Each of brushes 20 is rotated about its central axis by motor 40. The rotary motion of roller 30 is then transferred to wafer 10 when the edge of each roller 30 comes into contact with the outer edge of wafer 10.

Brush cleaning systems can effectively process the top and bottom of semiconductor substrates. However, brushes do not provide a sufficient amount of mechanical energy at the edge/bevel to remove contamination. In other words, although the double sided scrubber of FIG. 1 is effective at cleaning the front and back side of a wafer, it can leave a residue on the edge/bevel of the wafer.

One solution to cleaning the edge/based areas is shown in U.S. Pat. No. 5,861,066, entitled "Method and Apparatus for Cleaning Edges of Contaminated Substrates", issued Jan. 19, 1999 in which the edge and/or based areas may be cleaned using rollers that contact the outer edge of a wafer, similar to roller 30 coming into contact with wafer 10 above, except that one of the rollers includes an abrasive area and rotates such that the tangential velocity at the point of contact between the one roller and the wafer is different than the speed at which the other roller rotates the wafer. It is because of this difference in speed that the edge/bevel area is cleaned by the abrasive area.

SUMMARY OF THE INVENTION

A method and apparatus for processing the edge of semiconductor wafers is described. In one embodiment, a first brush assembly is disposed beneath the wafer to provide support for and to process the wafer and a second brush assembly is disposed above the wafer to process the wafer. Pressure applied to the wafer is non-uniform across the wafer.

In one embodiment, one or more rollers rotate the wafer between the first and second brush assemblies. The non-uniform pressure causes rotation of the wafer to slow or reverse. A pad in one or more of the rollers cleans the edge of the wafer. In one embodiment, the non-uniform pressure causes the first brush assembly and/or the second brush assembly to clean the edge of the wafer.

In one embodiment, the non-uniform pressure is applied with the second brush assembly from above the wafer. In alternative embodiments, the non-uniform pressure is applied with the first brush assembly from below the wafer or some combination of the first and second brush assemblies.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

A system for processing the edge/bevel of semiconductor wafers is described. In the following description, numerous details are set forth, such as component materials, speeds, pressures etc. It will be apparent, however, to one skilled in the art, that the present invention may be practiced without these specific details. In other instances, well-known structures and devices are shown in block diagram form, rather than in detail, in order to avoid obscuring the present invention.

Overview of the Present Invention

The present invention provides a method and apparatus for processing semiconductor wafers. In one embodiment, the system includes two scrubbing stations. In one embodiment, the scrubbing stations perform brush scrubbing of the opposite sides of the wafer simultaneously.

In one embodiment, each scrubbing station includes one or more scrubbing elements, at least one of which is positioned by a second assembly, where portions of the first and second assemblies are substantially the same. The scrubbing elements are processing elements that may comprise pads and/or brushes.

In one embodiment, at least one of the brush scrubbing stations includes an assembly configurable to apply a processing element, which may be a brush or a pad media, to a semiconductor wafer at various pressures. These various pressures may include a first set of pressures sufficient to scrub a semiconductor wafer. Additionally, pressure applied can be different on opposite sides of the brush or pad. In one embodiment, non-uniform pressure is applied to the wafer to process (e.g., scrub, clean, buff) the edge/bevel of the wafer.

In one embodiment, a processing box includes a brush assembly and a positioning assembly. The brush assembly may comprise a pair of pads and/or brushes for cleaning wafers and a mechanism to control and drive the brushes and/or pads. The positioning assembly may be used to position various components and devices in a processing system. In one embodiment, such components include wafer handling and manipulation devices, such as rollers, wheels, guides, one or more robots. For example, see U.S. patent application Ser. No. 08/705,115, entitled "A Containment Apparatus," filed Aug. 29, 1996; U.S. patent application Ser. No. 08/705,162, entitled "A Roller Positioning Apparatus," filed Aug. 29, 1996; and U.S. patent application Serial No. 08/705,161, entitled "A Brush Assembly Apparatus," filed Aug. 29, 1996, all assigned to the corporate assignee of the present invention and incorporated herein by reference.

The processing box may be incorporated into a wafer processing system having multiple processing stations. For instance, the wafer processing system may have one or more stations for cleaning (e.g., scrubbing) and/or buffing substrates. Note that although embodiments may be described in terms of cleaning by performing brush scrubbing of wafers, wafer cleaning techniques other than scrubbing may be employed in one or more of the processing stations.

Although embodiments are described in conjunction with scrubbing a wafer, it will be appreciated that any similarly shaped, i.e. generally applied substrate, may be processed. Further, it will be appreciated that reference to a wafer or substrate may include a bare or pure semiconductor substrate with or without doping, a semiconductor substrate with epitaxial layers, a semiconductor substrate incorporating one or more device layers at any stage of processing, or other types of substrates incorporating one or more semiconductor layers such as substrates having semiconductor-on-insulator (SOI) devices or substrates for processing other apparatuses and devices, such as flat panel displays, hard disks, multi-chip modules, etc.

In one embodiment, pressure applied at one end of the brush assembly is 2–4 times greater than at the opposite end of the brush assembly. The increased pressure at one end of the brush/pad assembly causes the wafer to rotate more slowly or to rotate in the opposite direction as compared to rotation caused by the roller(s) alone. Slowed rotation causes a difference in tangential velocity between the roller (s) and the wafer edge/bevel that causes pads in the roller(s) to process (e.g., clean) the edge/bevel of the wafer. In one embodiment, the opposite direction of rotation causes the wafer to rotate counter to roller(s) that causes pads in the roller(s) to process the edgelbevel of the wafer.

An Exemplary System

Figure 2:
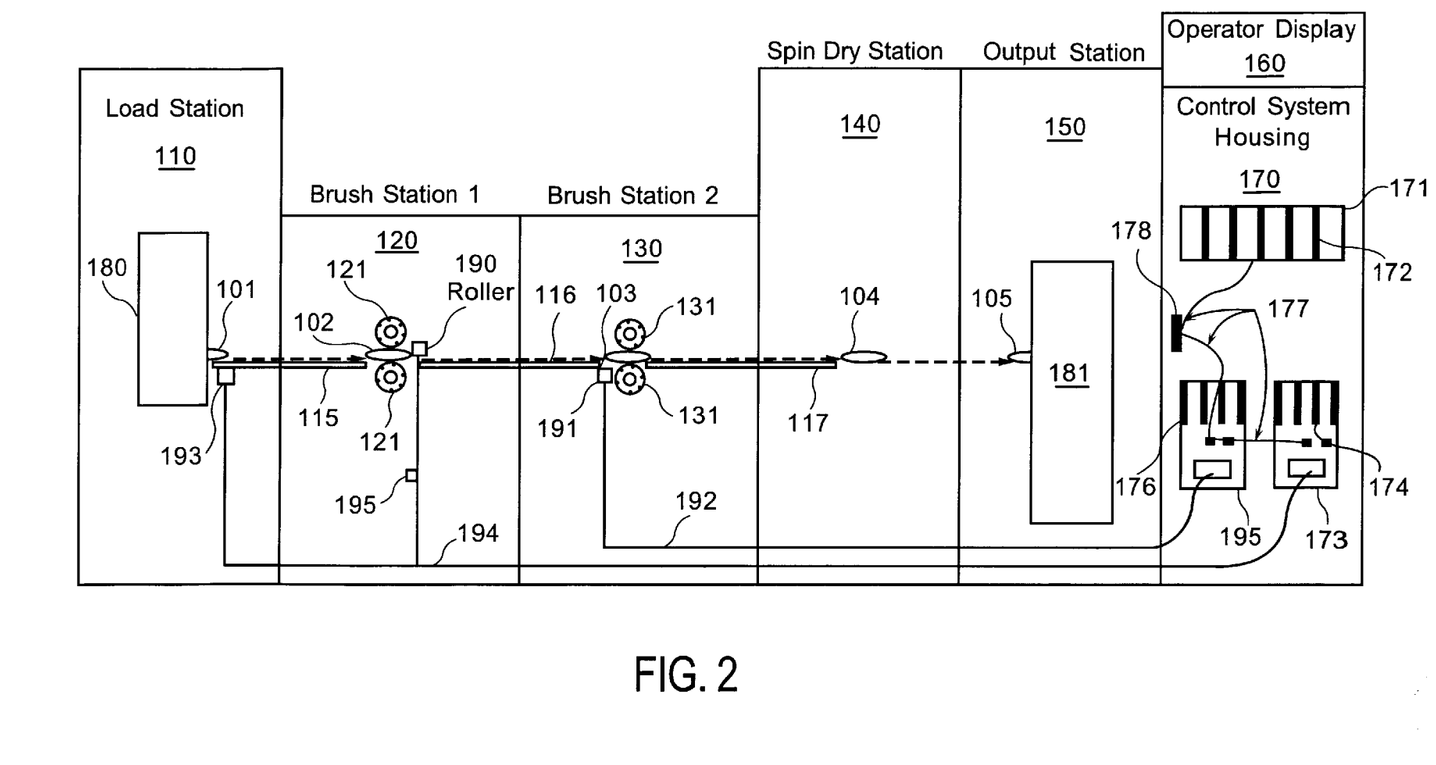
FIG. 2 illustrates an exemplary processing system.

FIG. 2 illustrates a conceptual view of one embodiment of a double sided wafer processing system. The system includes multiple stations, each of which logically represents one or more steps in the wafer buffing and cleaning process. These stations can also include the hardware and software that completes one of the steps in the process. The process includes the steps executed by the system on the wafers.

In one embodiment, the system can process multiple wafers simultaneously; one or more wafers are being processed in each of the stations at a point in time (pipelined processing). In one embodiment, the system provides an acidic (low pH) cleaning process for wafers. The cleaning process may comprise a hydrofluoric (HF) or standard clean 1 (SC2) cleaning process. In order to withstand the corrosive effects of the acid, plastic components in the system may be comprised of such materials such as PET, acetal (DELRIN), teflon, polypropylene (polypro), polyuerethane, etc., and metal components may comprise stainless steel, such as Hastelloy C276. Note that the system may apply other cleaning or buffing processes.

It should be noted that the brush assembly operates on a processing box that may facilitate the use of dionized (DI) water in the process. In one embodiment, the processing box is fully capable of running different chemistries. For instance, hydrofluoric (HF) acid may be run in the processing box. Importantly, the processing box provides the ability to apply pressure similar to a polisher and still process all the chemicals for cleaning.

Dirty wafers are loaded at one end of the scrubber; clean wafers are unloaded from the other end of the scrubber. In load station 110 (also known as the input station), the operator loads a cassette 180 into the system. Cassette 180 contains a number of dirty wafers that are moved from load station 110 to station 120 on transport belt 115. Transport belt 115 is moved by DC motor 193. Wafer 101 represents a dirty wafer being automatically removed from cassette 180 and placed on transport belt 115.

As part of a cleaning process, in station 120, dirty wafer 102 is brushed and sprayed (water jets not shown in FIG. 2) to remove some of the particles from dirty wafer 102. Brushes 121 scrub both sides of dirty wafer 102 simultaneously. The position of the top brush is controlled by a stepper motor (not shown in FIG. 2). Roller 190 rotates dirty wafer 102. The height of the top brush is controlled by a stepper motor (not shown but described in greater detail below). Roller 190 rotates wafer 102. Multiple rollers can be included in station 120.

In one embodiment, the edge/bevel areas of a wafer are cleaned using the roller 190. Wafer 102 is cleaned by applying equal amounts of pressure to both ends of the brush/pad assembly for a predetermined period of time. Pressure is applied unequally to the ends of the brush/pad assembly such that the rotation of wafer 102 is slowed or its rotation is reversed (i.e., in the opposite direction of the direction that roller 190 would otherwise cause wafer 102 to rotate). The slowed or counter rotation combined with pads in roller 190 (described in greater detail below) clean the edges of wafer 102. Edge cleaning by applying unequal pressure with the brush/pad assembly can be performed before or after top and bottom wafer cleaning by applying equal pressure to the brush/pad assembly.

The once brushed wafers are then moved to station 130 by transport belt 116, controlled by a second DC motor (not shown in FIG. 2). In station 130, once brushed wafer 103 is brushed and sprayed (water jets not shown in FIG. 2) to remove additional particles from wafer 103. Brushes 131 scrub both sides of the once brushed wafer 103. The position of the top brush of brushes 131 are controlled by stepper motor 191. Edge cleaning can be performed at station 130, in addition to or in place of, edge cleaning at station 120. Edge cleaning at station 130 may require addition of one or more rollers to station 130.

Spin & dry station 140 rinses, spins, and dries wafers, such as wafer 103. Wafer 104 represents a wafer being processed in spin & dry station 140. At station 140, the wafer has been cleaned. Certain wafer types must be kept wet during the load station 110, station 120 and station 130. Only after being brushed and rinsed can these wafers be spun and dried. The spun and dried wafer is then moved to output station 150.

At output station 150, the clean wafer is put into cassette 181. Wafer 105 represents a clean wafer being put into cassette 181. Cassette 181, when full of clean wafers, can then be removed by the operator, which completes the cleaning process.

Control system housing 170 houses a number of components of the control system for the system. Control system housing 170 includes cage 171 having board 172. Board 172 provides overall control for the system. Board 172 typically includes one or more processors and memory implemented in one or more physical packages. Cage 171 may provide support for board 172 and other boards in cage 171 (e.g., sensor input boards, a video card for operator display 160, a board for communicating signals from the host board 172 to the rest of the control system).

Figure 3:
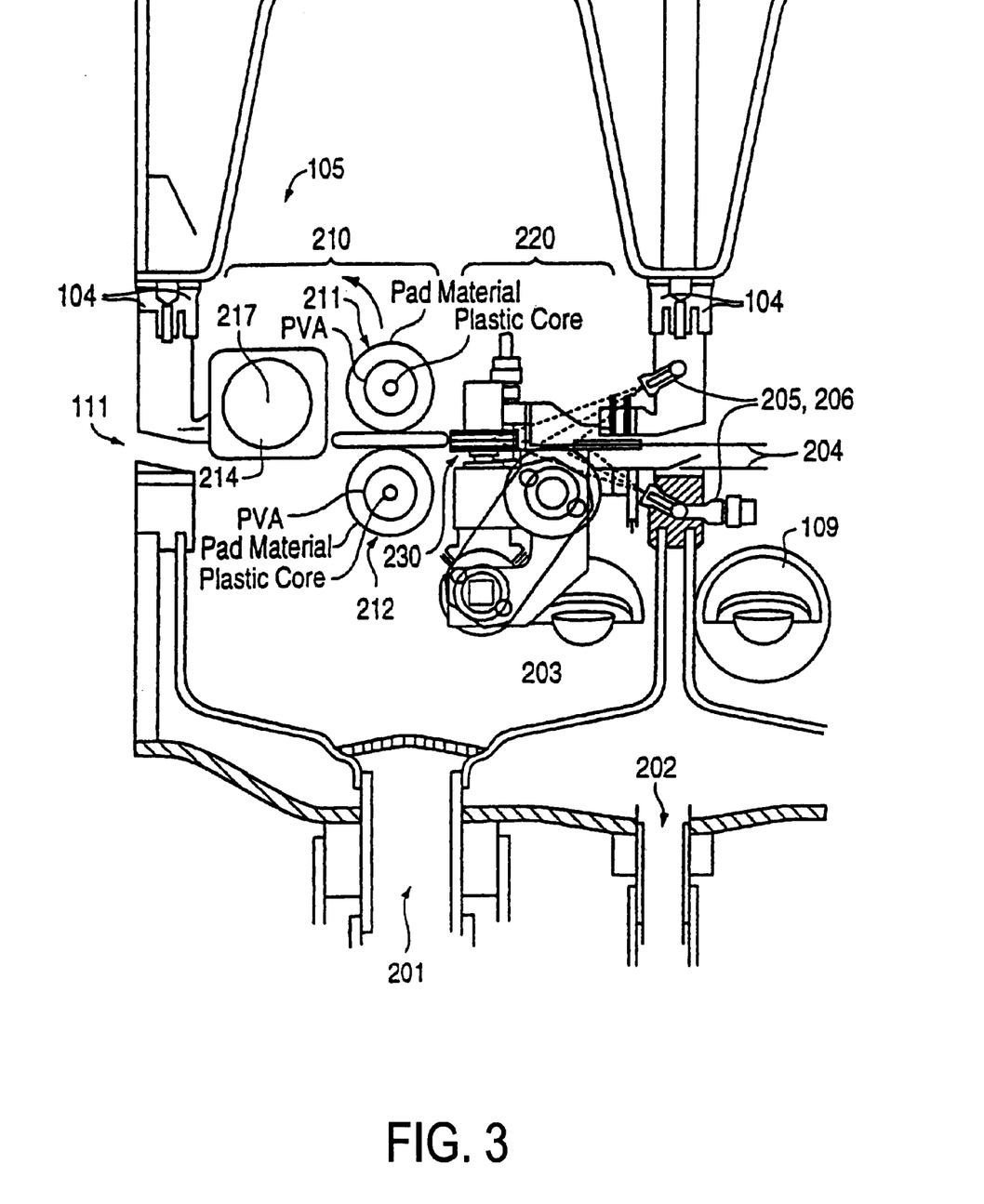
FIG. 3 illustrates a side view of one embodiment of a brush box and a portion of the brush box containment apparatus.

FIG. 3 illustrates a side view of one embodiment of brush box 105. Brush box 105 is shown to contain brush assembly 210 comprising scrubbing brushes 211 and 212 for scrubbing both sides of a wafer at the same time and brush drive mechanism 214 with brush pivot point 217, as are described in more detail below. Brush drive mechanism 214 is coupled to drive brush 211 and is also described in greater detail below.

Figures 4A, 4B:
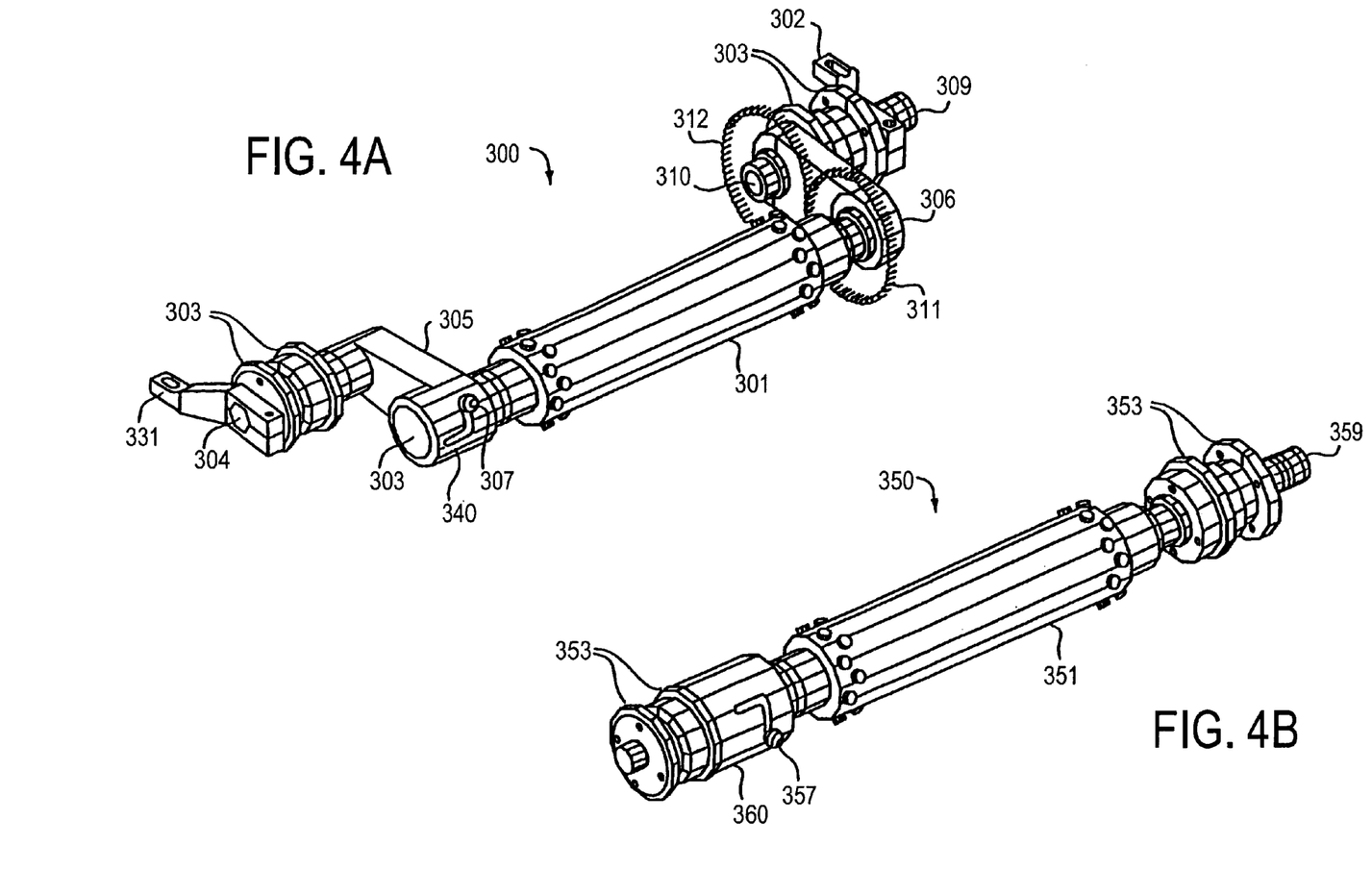
FIG. 4A illustrates a perspective view of one embodiment of the upper brush assembly of the present invention.
FIG. 4B illustrates a perspective view of one embodiment of the lower brush assembly of the present invention.
Figure 4C:
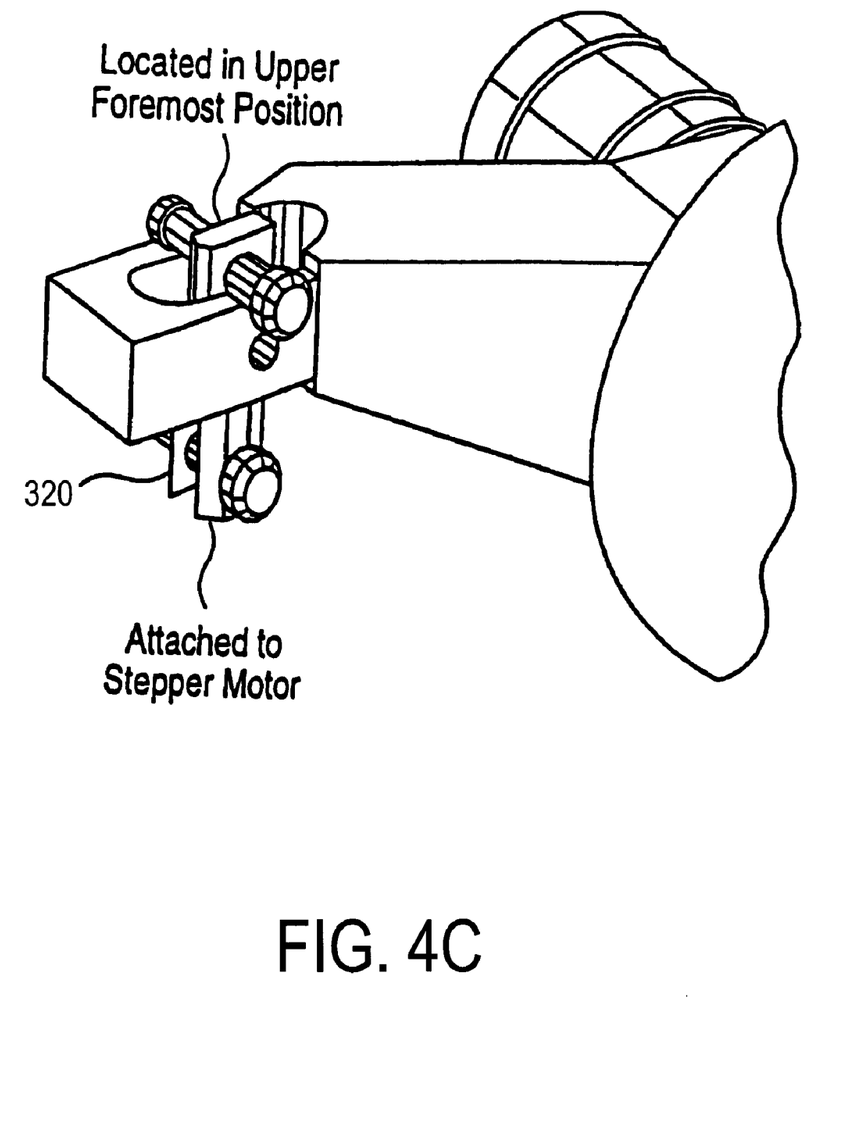
FIG. 4C illustrates one embodiment of a rotating arm and its coupling for attachment to a drive.
Figure 5A:
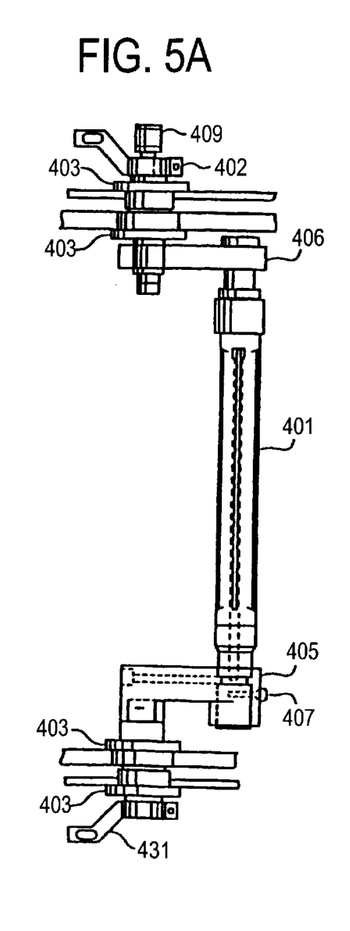
FIGS. 5A–5D illustrate a top views of embodiments of the upper and lower brush assemblies and section views of the upper and lower brush assemblies respectively.
Figure 5B:
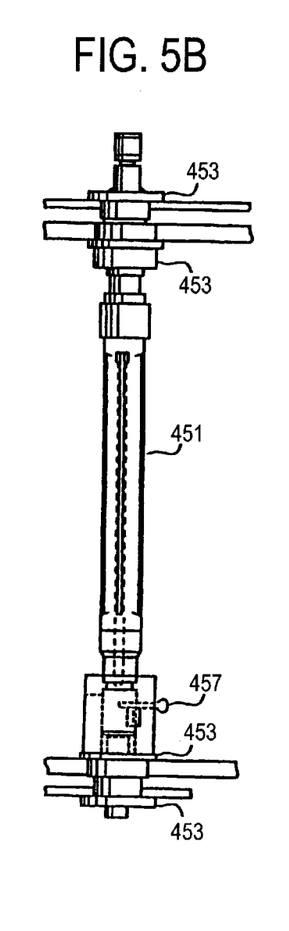
Figure 5C:
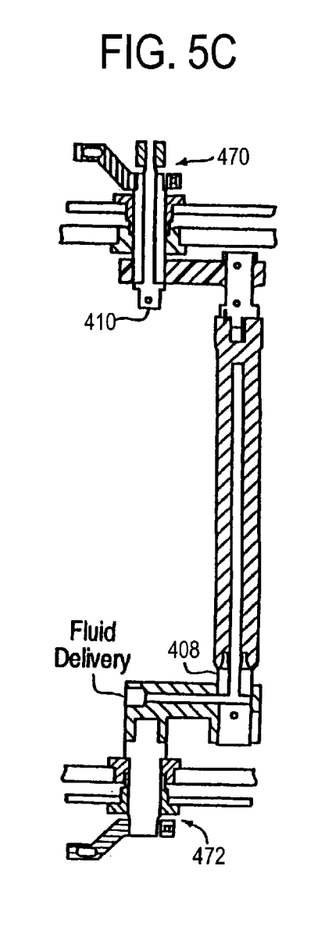
Figure 5D:
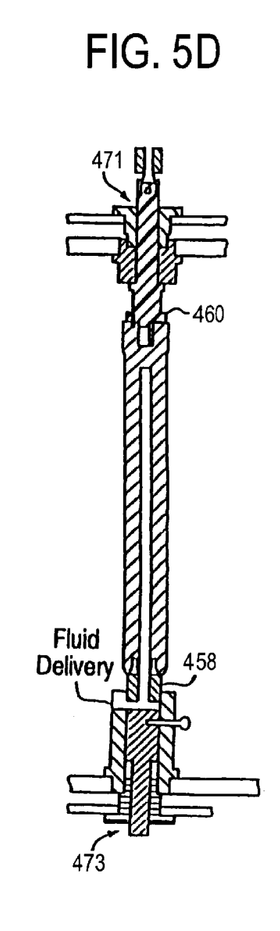

FIGS. 4A and 4B illustrate perspective views of the upper brush assembly and the lower brush assembly respectively of a brush assembly. FIG. 4C illustrates one portion of one embodiment of a rotating arm and its coupling to a drive. FIGS. 5A–5D illustrate a top view of the upper and lower brush assemblies and a section view of the upper and lower brush assemblies respectively. For more information on one embodiment of a brush box and a brush assembly, see U.S. Pat. No. 5,806,126, entitled, "Method and Apparatus for Chemical Delivery Through the Brush," issued Sep. 15, 1998, assigned to the corporate assignee of the present invention, and incorporated herein by reference. It should be noted that the actual brushes themselves (apart from the drive mechanism) are wellknown in the art. Note that FIGS. 4A and 4B and FIGS. 5A–5D are described in terms of brushes, however, the assemblies may be configured for pads for scrubbing or other processing (e.g., buffing). Each of these brushes includes multiple protrusions (not shown) to facilitate the cleaning of wafers.

In one embodiment, the upper and lower brushes provide fluid to the core of the brush to be dispersed to the outside of the brush through the brush surface. Such brushes and fluid delivery system will not be described in detail herein. For descriptions on exemplary brushes and more information on the system for fluid delivery through the brush, see U.S. Pat. No. 5,806,126, entitled, "Method and Apparatus for Chemical Delivery Through the Brush," issued Sep. 15, 1998, assigned to the corporate assignee of the present invention and incorporated by reference herein.

In FIGS. 4A and 4B and FIGS. 5A–5D, each of the brush cores may be replaced by a pad roller assembly or other suitable material for buffing of the wafer. In this manner, each of the brush assemblies may be configured as a buffing assembly to buff one or more sides of the wafer. It should be noted that in this case the buffing pad roller assembly, much like the brush, is designed to disburse fluid from its core to the outside of the pad through the pad surface.

The materials used for the brushes may comprise PVA or polyurethane type of material. The top and bottom brushes may be the same or different materials. In another embodiment, the material comprises a combination of PVA or polyurethane type material with a polishing pad on top. The shape of the brush may be in the form of a round cylinder and in such a case may be a flat PVA brush. In another embodiment, a flat PVA brush may be wrapped with a soft polishing pad.

In one embodiment, the contact area that occurs between the brushes and the wafer is controlled by selecting materials of different technologies. The position of the brush core and the compressibility of the material determine the contact area and pressure that are applied. Therefore, by selecting a brush or pad with certain compressibility with the same brush core, the contact area may be changed.

The brush positioning apparatus that causes brush core 301 to be applied to the wafer may be controlled to apply brush core 301 to the wafer at various pressures. In other words, the brushes are physically attached so that they may be physically moved (pushed down). By pushing up on the end of rotating arms 331 and 302 with greater force from the stepper motor, brush core 301 is applied to the wafer with increased pressure.

The microsteps produce greater brush movement than in the prior art. As illustrated, the amount of pressure that may be applied is greater than that of the prior art, even 4–5 times greater. The increased pressure applied allows removal of embedded particles on the wafer during scrubbing. Using the HF-based process, in conjunction with the increased pressure, provides an overall better cleaning process.

To clean the edges of the wafer, the stepper motor connected to one of rotating arms 331 and 302 applies greater pressure than the stepper motor connected to the opposite rotating arm. For example, one of the stepping motors can be configured to raise the corresponding rotating arm 1–3mm more than the opposite rotating arm, or to apply sufficient pressure to cause the wafer to rotate in the opposite direction than the wafer would rotate if driven by a roller.

In an alternative embodiment, lower brush assembly 350 includes rotating arms to allow lower brush assembly to be moved and/or pressure to be applied to the bottom of the wafer. In such embodiment, pressure can be applied unevenly as discussed above with respect to upper brush assembly 300. Thus, pressure can be applied from the top, from the bottom, or some combination thereof.

Figure 6:
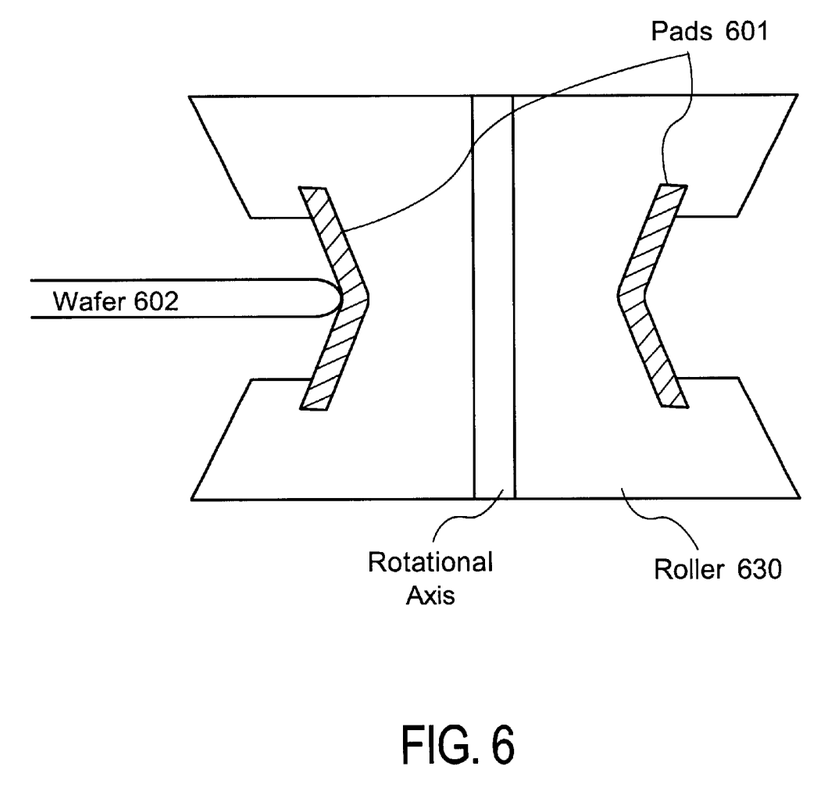
FIG. 6 illustrates a side section view of a pad and roller combination used for processing the edge of a substrate.

FIG. 6 illustrates one embodiment of a roller with a pad. An exemplary wafer 602 is also shown. In one embodiment, pad 601 comprises a SubaIV pad manufactured by Rodel of Newark, Del. Other pads such as IC1000, suba500, politex (all manufactured by Rodel) can also be used.

Note that pad 601 can be of different thickness and surface texture to increase and/or even maximize the cleaning action. The pad may also be shaped to remove particles only from an edge, where for instance, the wafer is without bevel areas that cannot be cleaned by the top and bottom brushes.

For more information, see U.S. Pat. No. 5,861,066, entitled "Method and Apparatus For Cleaning Edges of Contaminated Substrates", issued Jan. 19, 1999, assigned to the corporate assignee of the present invention and incorporated herein by reference.

Figure 7A:
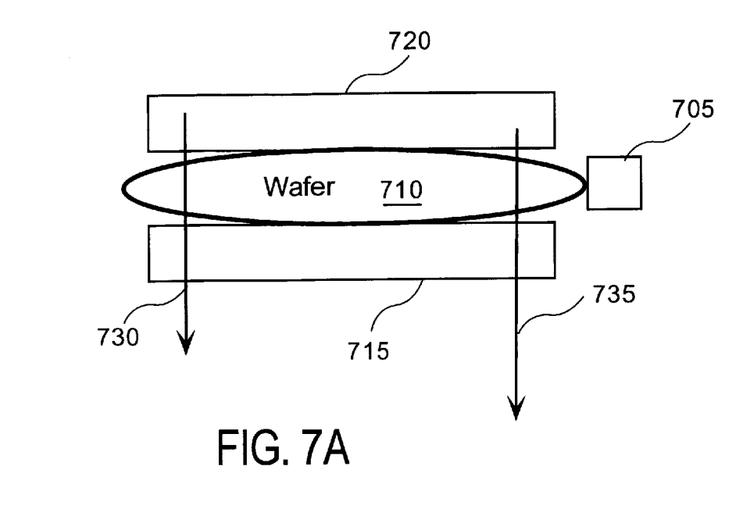
FIGS. 7A–7C illustrate various pressure application schemes for processing the edge of a substrate using non-uniformly distributed pressure with upper and/or lower brush assemblies.
Figure 7B:
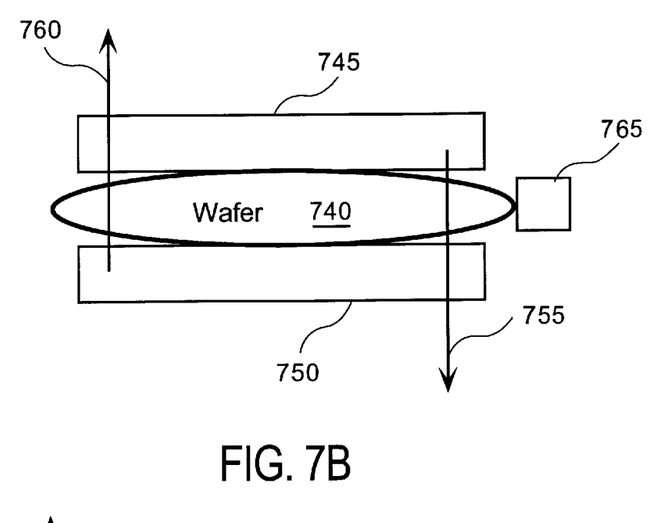
Figure 7C:
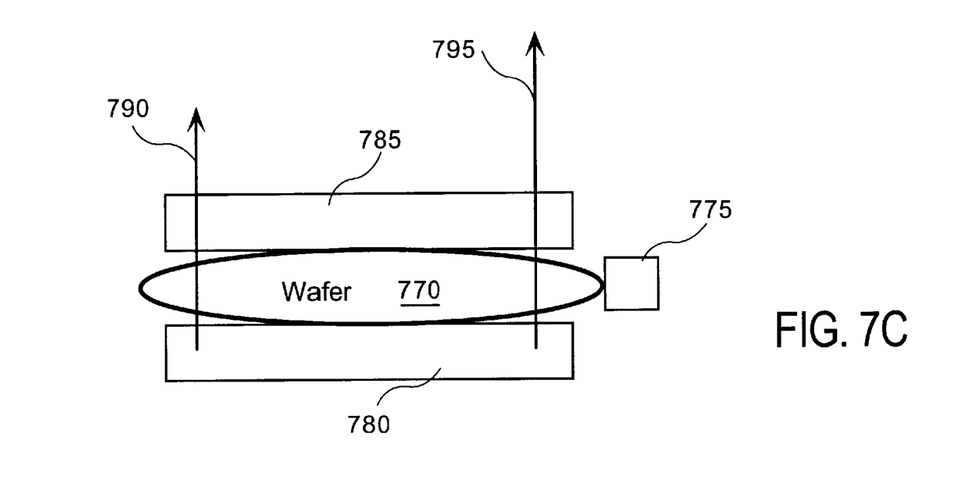

FIGS. 7A–7C illustrate various pressure application schemes for cleaning the edge of a substrate using unequally distributed pressure with upper and/or lower brush assemblies. FIGS. 7A–7C illustrate three of many embodiments for applying non-uniform pressure to a wafer with upper and lower brush assemblies. The present invention is not strictly limited to the three embodiments illustrated.

FIG. 7A illustrates one embodiment of applying non-uniform pressure to wafer 710 with upper brush assembly 720. Referring to FIG. 7A, lower brush assembly 715 provides support for wafer 710. In one embodiment both upper brush assembly 720 and lower brush assembly 715 have brushes to provide double sided wafer processing.

Wafer 710 is rotated by roller 705. In one embodiment, roller 705 includes a pad for cleaning the edges of wafer 710 in a manner similar to the roller of FIG. 6. Alternatively, roller 705 does not have a pad for cleaning edges and upper brush assembly 720 cleans the edges of wafer 710. While the embodiment of FIG. 7A is described in terms of a single roller, multiple rollers can be used, with one or more of the rollers having a pad for cleaning the edges of wafer 710.

Pressure vectors 730 and 735 indicate pressure applied by upper brush assembly 720. The length of vectors 730 and 735 indicate the magnitude of pressure applied at the respective ends of upper brush assembly 720. In one embodiment, pressure vector 735 is twice pressure vector 730 indicating that the pressure applied at one end of upper brush assembly 720 is double the pressure applied at the opposite end of upper brush assembly 720.

In an alternative embodiment, pressure vector 735 is four times greater than pressure 730 (not shown in FIG. 7A), which corresponds to the pressure at one end of upper brush assembly 720 being four times greater than the pressure applied at the opposite end of upper brush assembly 720. Of course, other pressure ratios between the ends of upper brush assembly 720 can also be used.

In one embodiment, pressure is applied with a stepper motor raising and lowering rotating arms on upper brush assembly 720 in a manner such as with the embodiments of FIGS. 4A and 4C. For example, a stepper motor connected to one end of upper brush assembly 720 can raise a connected rotating arm to a first predetermined position thereby applying a first pressure to wafer 710. A stepper motor connected to the opposite end of upper brush assembly 720 moves upper brush assembly 720 to a second predetermined position thereby applying a second pressure to wafer 710 and providing non-uniform pressure across the surface of wafer 710.

In one embodiment, the pressure applied by upper brush assembly 720 causes wafer 710 to rotate in the reverse direction as compared to rotation with roller 705 alone. The greater pressure indicated by pressure vector 735 is sufficient to grip wafer 710 and cause the rotation of wafer 710 to reverse. The reverse rotation causes the edges of wafer 710 to be cleaned by the pad of roller 705 (not shown in FIG. 7A).

In an alternative embodiment, the pressure indicated by pressure vector 735 causes the rotation of wafer 710 to slow as compared to rotation caused by roller 705 alone. The difference in tangential velocity between wafer 710 and roller 705 causes the edges of wafer 710 to be cleaned by the pad of roller 705.

FIG. 7B illustrates one embodiment of applying non-uniform pressure to wafer 740 with both upper brush assembly 745 and lower brush assembly 750. In such an embodiment, lower brush assembly 750 provides support for wafer 740 as well as applying pressure to wafer 740. Wafer 740 is rotated by roller 765, which can include a pad (not shown in FIG. 7B) for cleaning the edges of wafer 740.

In one embodiment, the amount of pressure applied at one end of upper brush assembly 745 and at the opposite end of lower brush assembly 750 is equal, as indicated by pressure vectors 755 and 760. Of course, the amount of pressure applied by upper brush assembly 745 is not required to be equal to the amount of pressure applied by lower brush assembly 750.

In order to apply pressure with both upper brush assembly 745 and lower brush assembly 750, both brush assemblies are movable such as the brush assembly of FIG. 4A. In one embodiment, upper brush assembly 745 is a brush assembly similar to the brush assembly of FIG. 4A and lower brush assembly 750 has only a single rotating arm to apply pressure to the lower surface of wafer 740.

The rotating arms of upper brush assembly 745 and lower brush assembly 750 are connected to stepper motors that provide movement of the rotating arms and thereby apply pressure to wafer 740.

FIG. 7C illustrates one embodiment for applying non-uniform pressure to wafer 770 with lower brush assembly 780. Wafer 770 is rotated by roller 775, which can include a pad (not shown in FIG. 7C) for cleaning the edges of wafer 770.

In one embodiment, upper brush assembly 785 is fixed and provides a surface against which lower brush assembly 780 can be used to apply non-uniform pressure to wafer 770. Alternatively, upper brush assembly 785 can be movable, but provide uniform pressure across the surface contacting wafer 770.

In one embodiment, lower brush assembly 780 has two rotating arms connected to stepper motors to provide pressure against the lower surface of wafer 770. In one embodiment, pressure is applied as shown by pressure vectors 790 and 795. Any ratio of pressures between pressure vectors 790 and 795 can be provided.

Whereas many alterations and modifications of the present invention will no doubt become apparent to a person of ordinary skill in the art after having read the foregoing description, it is to be understood that the various embodiments shown and described by way of illustration are in no way intended to be considered limiting. Therefore, references to details of various embodiments are not intended to limit the scope of the claims which in themselves recite only those features regarded as essential to the invention.

What is claimed is:

1. A method of processing a wafer, the method comprising:

supporting a wafer to be processed;

applying a processing element across a first surface of the wafer, the processing element having a first end and a second end and being configured to rotate;

applying a first pressure to the first end of the rotating processing element; and applying a second pressure to the second end of the rotating processing element, wherein the first and second pressures are not equal and thereby apply the rotating processing element across the wafer with non-uniform pressure.

2. A method of processing a wafer as recited in claim 1, further comprising:

rotating a roller at a rotational speed; and applying a first rotational force to an edge of the wafer with the roller causing the wafer to rotate in a first rotation direction at a first tangential velocity which is approximately equal to the rotational speed.

3. A method of processing a wafer as recited in claim 2, wherein the rotating processing element applied across the wafer with non-uniform pressure applies a second rotational force to the first surface of the wafer, the non-uniform pressure being configured to apply the second rotational force in proportion to the first pressure and the second pressure applied to the first end and the second end of the processing element.

4. A method of processing a wafer as recited in claim 3, wherein the second rotational force at a portion of the wafer under the first end of the processing element is greater than the first rotational force.

5. A method of processing a wafer as recited in claim 4, further comprising;

applying the first pressure to the first end of the processing element to slow the rotating of the wafer in the first rotation direction to a second tangential velocity in the first rotation direction that is slower than a rotational speed of the roller; and preparing the edge of the wafer with a frictional contact between the edge of the wafer and the roller generated by a differential between the second tangential velocity and the rotational speed of the roller.

6. A method of processing a wafer as recited in claim 4, further comprising;

applying the first pressure to the first end of the processing element to cause the rotation of the wafer be in a second rotation direction which is opposite the first rotation direction; and preparing the edge of the wafer with a frictional contact between the edge of the wafer and the roller.

7. A method of processing a wafer as recited in claim 1, wherein the processing element is one of a brush or pad.

8. A method of processing a wafer as recited in claim 2, wherein the roller is configured with a preparation surface in a region of the roller configured to contact the edge of the wafer.

9. An apparatus for processing a wafer, the apparatus comprising:

a processing element with a first end and a second end configured to process a first surface of the wafer;

a processing element assembly configured to position the processing element across the first surface of the wafer, and to apply rotation to the processing element;

a first processing element positioning apparatus configured to position the first end of the processing element with a first force against the surface of the wafer;

a second processing element positioning apparatus configured to position the second end of the processing element with a second force against the surface of the wafer; and a roller configured to rotate at a roller rotation speed, and to apply a roller rotational force to an edge of the wafer thereby causing the wafer to rotate at a first tangential velocity which is approximately equal to the roller rotation speed.

10. An apparatus for processing a wafer as recited in claim 9, wherein the first force and the second force apply a processing element rotation to the wafer in proportion to the first force and the second force.

11. An apparatus for processing a wafer as recited in claim 10, wherein the processing element rotation is sufficient to cause the wafer to rotate at a second tangential velocity which is slower than the roller rotation speed.

12. An apparatus for processing a wafer as recited in claim 10, wherein the processing element rotation is sufficient to cause the wafer to rotate in a direction opposite to a roller rotation direction.

13. An apparatus for processing a wafer as recited in claim 9, wherein the processing element includes one of a brush and a pad.

14. An apparatus for processing a wafer as recited in claim 9, wherein the roller is configured with a preparation surface in a region configured to contact the edge of the wafer.

15. A method of processing a wafer, comprising:

inserting a wafer between an upper processing element and a lower processing element;

applying the upper processing element across a first surface of the wafer, the upper processing element having a first upper end and a second upper end and being configured to rotate;

applying the lower processing element across a second surface of the wafer, the lower processing element having a first lower end and a second lower end and being configured to rotate;

applying a first upper pressure to the first upper end of the rotating upper processing element;

applying a second upper pressure to the second upper end of the rotating upper processing element, wherein the first upper pressure and the second upper pressure are not equal and thereby apply the rotating upper processing element across the first surface of the wafer with non-uniform pressure; and rotating a roller at a roller rotational speed configured to apply a first rotational force to an edge of the wafer and rotate the wafer in a first rotation direction at a first tangential velocity which is approximately equal to the roller rotational speed.

16. A method of processing a wafer as recited in claim 15, further comprising:

applying a first lower pressure to the first lower end of the rotating lower processing element;

applying a second lower pressure to the second lower end of the rotating lower processing element;

wherein the lower rotating processing element prepares the second surface of the wafer; and wherein the lower processing element supports the wafer.

17. A method of processing a wafer as recited in claim 15, wherein the rotating upper processing element applied across the first surface of the wafer with non-uniform pressure applies a second rotational force to the first surface of the wafer, the non-uniform pressure being configured to apply the second rotational force in proportion to the first upper pressure and the second upper pressure applied to the first upper end and the second upper end of the upper processing element.

18. A method of processing a wafer as recited in claim 17, wherein the second rotational force at a portion of the wafer under the first upper end of the upper processing element is greater than the first rotational force.

19. A method of processing a wafer as recited in claim 18, further comprising;

applying the first upper pressure to the first upper end of the upper processing element to slow the rotating of the wafer in the first rotation direction to a second tangential velocity in the first rotation direction that is slower than the roller rotational speed; and preparing the edge of the wafer with a frictional contact between the edge of the wafer and the roller generated by a differential between the second tangential velocity and the roller rotational speed.

20. A method of processing a wafer as recited in claim 18, further comprising;

applying the first upper pressure to the first upper end of the upper processing element to cause the rotation of the wafer be in a second rotation direction which is opposite the first rotation direction; and preparing the edge of the wafer with a frictional contact between the edge of the wafer and the roller.

* * * * *